(12) United States Patent
Pathangi Sriraman

(10) Patent No.: US 9,991,115 B2
(45) Date of Patent: Jun. 5, 2018

(54) DIRECTED SELF-ASSEMBLY USING TRENCH ASSISTED CHEMOEPITAXY

(71) Applicant: IMEC VZW, Leuven (BE)

(72) Inventor: Hari Pathangi Sriraman, Rangarajapuran (IN)

(73) Assignee: IMEC VZW, Leuven (BE)

( * ) Notice: Subject to any disclaimer, the term of this patent is extended or adjusted under 35 U.S.C. 154(b) by 76 days.

(21) Appl. No.: 15/258,304

(22) Filed: Sep. 7, 2016

(65) Prior Publication Data
US 2017/0069486 A1   Mar. 9, 2017

(30) Foreign Application Priority Data

Sep. 7, 2015   (EP) .................... 15184021

(51) Int. Cl.
*H01L 21/027* (2006.01)
*H01L 21/033* (2006.01)
*H01L 21/3105* (2006.01)

(52) U.S. Cl.
CPC ...... *H01L 21/0273* (2013.01); *H01L 21/0337* (2013.01); *H01L 21/31058* (2013.01)

(58) Field of Classification Search
CPC .................... H01L 21/0273; H01L 21/0337
See application file for complete search history.

(56) References Cited

U.S. PATENT DOCUMENTS

2011/0147984 A1   6/2011  Cheng et al.
2017/0148641 A1*  5/2017  Tobana ............ H01L 21/31138

OTHER PUBLICATIONS

Liu, Chi-Chun et al., "Fabrication of Lithographically Defined Chemically Patterned Polymer Brushes and Mats", Macromolecules, vol. 44, 2011, pp. 1876-1885.
Delgadillo, Paulina Rincon et al., Defect Source Analysis of Directed Self-Assembly Process (DSA of DSA), Proc. of SPIE, vol. 8680, 2013, pp. 86800L-1-86800L-9.

* cited by examiner

*Primary Examiner* — Marc Armand
(74) *Attorney, Agent, or Firm* — McDonnell Boehnen Hulbert & Berghoff LLP

(57) ABSTRACT

The present disclosure relates to directed self-assembly using trench assisted chemoepitaxy. An example embodiment includes a method of forming a pre-patterned structure for directing a self-assembly of a self-assembling material that includes a first and a second component having different chemical natures. The method includes providing an assembly includes a substrate, a layer of pinning material overlying the substrate, and a resist pattern overlaying the layer of pinning material. The method also includes modifying a chemical nature of an exposed part of a top surface of the layer of pinning material. The method further includes removing the resist pattern. In addition, the method includes attaching a neutral layer to the layer of pinning material.

17 Claims, 4 Drawing Sheets

DIRECTED SELF-ASSEMBLY USING TRENCH ASSISTED CHEMOEPITAXY

CROSS-REFERENCE TO RELATED APPLICATIONS

The present application is a non-provisional patent application claiming priority to European Patent Application No. EP 15184021.2, filed Sep. 7, 2015, the contents of which are hereby incorporated by reference.

FIELD OF THE DISCLOSURE

The present disclosure relates to the formation of patterns using directed self-assembly and to the structures formed therefrom.

BACKGROUND

A constant challenge for lithography is to devise tools, materials, and processes that can reliably, efficiently, and quickly pattern structures with ever decreasing dimensions and pitch.

Directed Self-Assembly (DSA) lithography is a materials-based approach to lithography that relies on the phase separation of certain polymeric materials. A basic DSA process consists of coating a polymeric self-assembling material on a substrate over a previously formed guide (template) structure. The polymeric self-assembling material contains two (or more) components of different chemical nature. These components can for instance be blocks bonded together into a block copolymer. Immediately after coating, the blocks are relatively disordered, however, these blocks can be induced to separate into distinct phases and thereby form features with a characteristic pitch that is defined by the chemical composition of the block co-polymer. By coating such a block co-polymer film on a substrate with a well-defined guide structure, in terms of geometry and/or chemistry, the assembly of the block copolymer domains can be controlled. The pattern density achievable in the directed self-assembled block copolymer is typically a multiple of the pattern density of the guide structure. This increase in feature density, known as "density multiplication", yields an assembled pattern with greater resolution than the original, lithographically defined chemical pattern.

In Chi-Chun Liu et al. (macromolecules 2011, 44, 1876-1885) and in Delgadillo et al., (Proc. Of SPIE Vol. 8680 86800L-1, 2013), a chemical pattern fabrication method is disclosed with precise control in chemistry and geometry utilizing specialized materials and lithographic patterning techniques. The process started with the formation of a cross-linked polymer mat (cross-linked polystyrene, X-PS) on a substrate, and the formation of a resist line pattern on the X-PS. The resist line pattern was subsequently trimmed with oxygen plasma and simultaneously the X-PS between the lines was etched. This exposed the substrate in desired locations, formed XPS guide lines, and decreased the width of the resist pattern lines. Hydroxyl-terminated polymer brush was then coated and grafted to the exposed substrate to fill the trenches between the X-PS lines. However, we observed that the resulting pre-pattern structure has unwanted characteristics: The side walls of the XPS guide lines had a sloped profile, the guiding strength of the structure may not be optimal, and the subsequent stripping of the resist lines required aggressive stripping chemistries which, in addition to imposing environmental, health and security constraints, also impact the top of the XPS guide lines (which acts as the pinning surface for one of the block co-polymer domains during DSA). There is therefore still a need in the art for good methods to form patterns for directed self-assembly.

SUMMARY

Some embodiments provide good methods for forming pre-patterns for directed self-assembly.

In some embodiments, the method includes a low number of process steps.

In some embodiments, no plasma trimming of the resist pattern lines is used, thereby avoiding modification of the chemical nature of the resist pattern lines and avoiding modification of the layer of pinning material (e.g. X-PS layer or X-PMMA layer). As a result, the trimmed resist lines obtained during the method do not use aggressive stripping chemistries for their removal.

In some embodiments, the control of the target width of the resist lines is good.

In some embodiments, a pre-patterned structure is provided which is suitable for guiding directed self-assembling using both chemoepitaxy and graphoepitaxy simultaneously. Combining both chemoepitaxy and graphoepitaxy in the pre-patterned structures could result in low defectivity DSA flows using industry-friendly annealing conditions for the self-assembly process (lower anneal durations than the state of the art).

In some embodiments, pre-patterned structures with good guiding strength are provided. In particular, certain embodiments enhance the chemical pattern geometry and therefore the DSA guiding strength can be good.

In some embodiments, the defectivity of the resulting pre-patterned and patterned structures may be low.

In some embodiments, a monomodal distribution profile of DSA line width can be obtained.

In some embodiments, the pre-patterned structure does not interfere with the etching process involved in the etching of the DSA lines, i.e. with the removal of one of the blocks of the block copolymer which self-assembly has been directed by the pre-pattern.

In some embodiments, good pattern transfer from the DSA lines to an underlying substrate layer can be achieved.

The above objective is accomplished by a method and device, according to example embodiments.

In a first aspect, various embodiments relate to a method of forming a pre-patterned structure for guiding the self-assembly of a self-assembling material comprising a first and a second component of different chemical natures, the method comprising:
 a. Providing an assembly comprising:
  i. A substrate,
  ii. A layer of pinning material overlying the substrate and having a top surface having more affinity for one of the components than for the other, and
  iii. A resist pattern overlying the layer of pinning material, comprising resist lines having a width, and leaving part of the top surface of the pinning layer exposed,
 b. Optionally reducing the width of the resist lines while maintaining the layer of pinning material un-etched (thereby providing a trimmed resist pattern comprising trimmed resist lines),
 c. Modifying the chemical nature of the exposed part of the top surface of the pinning layer to provide chemical groups suitable for attaching a neutral layer, the neutral layer having substantially the same affinity toward the first and the second components of the self-assembling material, d. Removing the resist pattern, thereby uncovering a non-modified portion of the top surface of the layer of pinning material, and e. Attaching the neutral layer to the modified pinning layer (by reacting the neutral layer with the chemical groups), thereby forming a neutral layer pattern and providing the pre-pattern structure.

In a second aspect, various embodiments relate to a pre-patterned structure for directing the self-assembly of a self-assembling material comprising a first and a second component of different chemical natures, the pre-patterned structure comprising:

i. A substrate, ii. A layer of pinning material overlying the substrate and having a top surface having more affinity for one of the components than for the other, and iii. A pattern of neutral material overlying the layer of pinning material, and having substantially the same affinity toward the first and the second components of the self-assembling material, the pattern of neutral material having a thickness ranging from 3 to 15 nm.

In a third aspect, various embodiments relate to a kit of part comprising the pre-patterned structure according to any embodiment of the second aspect and the self-assembling material.

Particular aspects are set out in the accompanying independent and dependent claims. Features from the dependent claims may be combined with features of the independent claims and with features of other dependent claims as appropriate and not merely as explicitly set out in the claims.

Although there have been constant improvements, change and evolution of devices in this field, the present concepts are believed to represent substantial new and novel improvements, including departures from prior practices, resulting in the provision of more efficient, stable and reliable devices of this nature.

The above and other characteristics and features will become apparent from the following detailed description, taken in conjunction with the accompanying drawings. This description is given for the sake of example only, without limiting the scope defined by the claims. The reference figures quoted below refer to the attached drawings.

Figure 1:
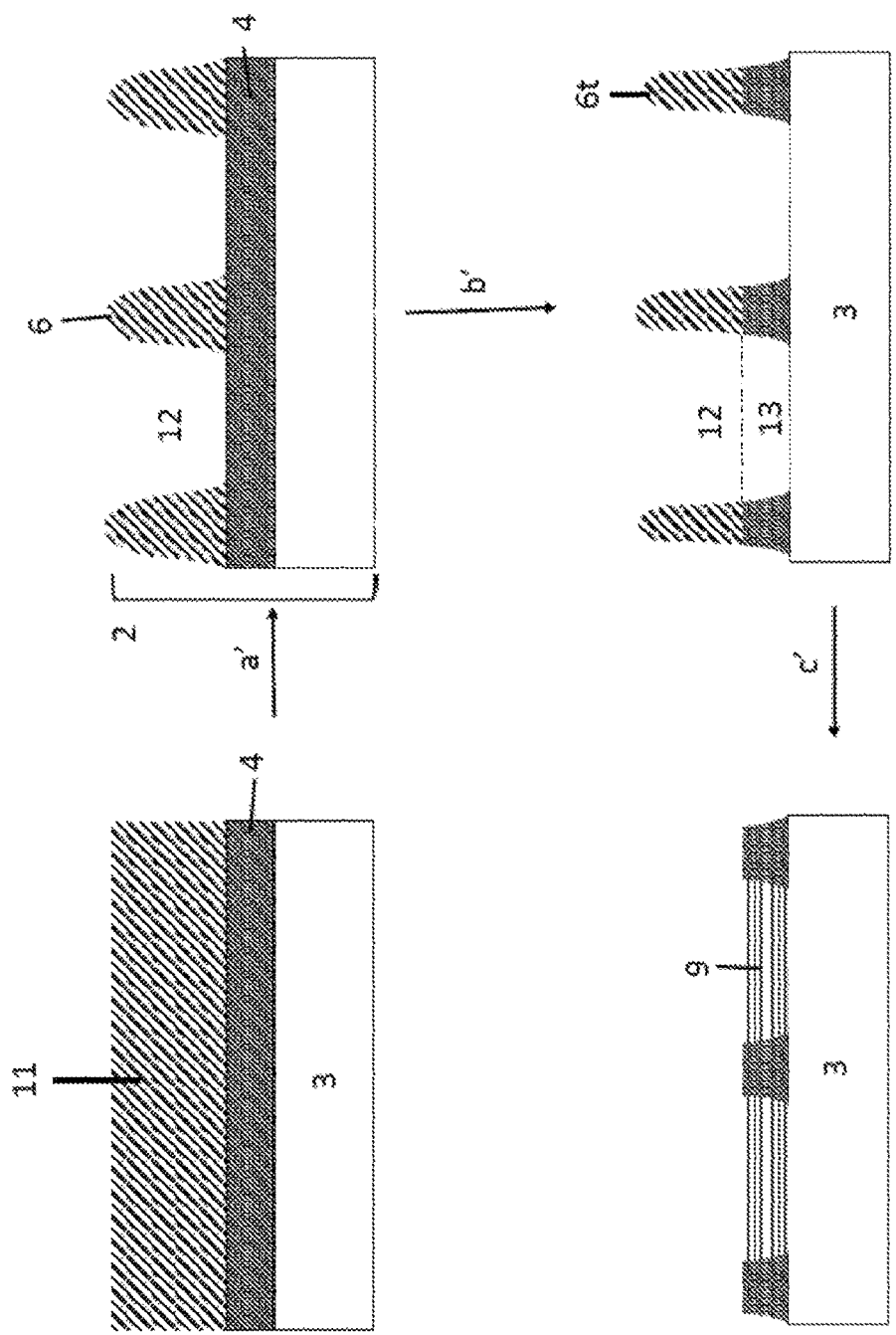
FIG. 1 is a schematic representation of a method, according to the prior art.

In the different figures, the same reference signs refer to the same or analogous elements.

DETAILED DESCRIPTION

Certain embodiments will be described with reference to certain drawings but are not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present embodiment, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of example embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that more features than are expressly recited in each claim are required. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the present disclosure, and may form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

The following terms are provided solely to aid in understanding of various embodiments.

As used herein and unless provided otherwise, the term "pre-pattern structure" refers to the patterned structure that will serve as a guide structure to direct the self-assembly of the DSA polymer, i.e. the patterned structure obtained just before the deposition of the DSA copolymer material.

As used herein and unless provided otherwise, the term "pinning material" refers to a material having a top surface having more affinity for one of the components of the DSA block copolymer than for the other. A higher affinity for one component typically implies that the top surface of the pinning material has a polarity closer to the polarity of this one component than to the polarity of the other component of the DSA block copolymer. The polarity of a layer can be estimated by the proxy of measuring its hydrophilicity via measurement of its contact angle toward water. In some embodiments, the contact angle measured for the pinning material is within 10°, or even within 5°, of the contact angle measured for the one component the pinning material has more affinity with. In some embodiments, the contact angle measured for the pinning material is at least 10°, or even at least 12°, away from the contact angle of the other component the pinning material has less affinity with. If we consider for instance an XPS pinning material having a contact angle of 87° and a PS-b-PMMA block copolymer which corresponding PS homopolymer has a contact angle of 87° and which corresponding PMMA homopolymer has a contact angle of 71°, the contact angle of the pinning material would indeed be within 10° of the PS component (actually 0°) and the contact angle of the pinning material would indeed by at least 10° away from the contact angle of the PMMA component (actually) 16°. The contact angle would of course have to be measured in the same conditions (e.g. the same conditions of relative humidity and temperature).

As used herein and unless provided otherwise, the term "neutral layer" relates to a layer of material having substantially the same affinity toward the first and the second components of the self-assembling material. Substantially the same affinity typically means that the difference of polarity between the neutral layer and one component is substantially the same as the difference in polarity between the other component and the neutral layer. In practice, this can be estimated by the proxy of measuring the hydrophilicity of the neutral layer via measurement of its contact angle toward water, and to compare this hydrophilicity with the hydrophilicity of one component on one hand and the hydrophilicity of the other component on another hand. The difference of polarity between the neutral layer and the one component can then be considered to be substantially the same as the difference of polarity between the neutral layer and the other component if the contact angle measured for the neutral layer lies in between the contact angle of both components and within 10°, or even within 5°, or even further within 2°, of the average between the contact angle measured for the one component and the contact angle measured for the other component. The contact angle for one component can for instance be evaluated by measuring the contact angle on a polymer obtained by the homopolymerization of the monomer polymerized in the one component.

If we consider for instance a random copolymer PS-r-PMMA as the neutral layer having a contact angle of 79° and a DSA PS-b-PMMA block copolymer which corresponding PS homopolymer has a contact angle of 87° and which corresponding PMMA homopolymer has a contact angle of 71°, the contact angle of the neutral layer would indeed be within 10° of the average between the contact angle measured for the one component and the contact angle measured for the other component [(87°+71°)/2=79° which is the value measured for the neutral layer and hence within 10° and even within 1° of that value].

Several example embodiments will now be described. It is clear that other embodiments can be configured according to the knowledge of persons skilled in the art without departing from the technical teaching described herein.

FIG. 1 shows a method according to the prior art (Delgadillo et al., Proc. Of SPIE Vol. 8680 86800L-1, 2013). On the top left of FIG. 1, it shows an assembly formed by overlaying a Si/SiN substrate (3) with a layer of pinning material (cross-linked PS, X-PS) (4), followed by the overlaying of the top surface (7) of the pinning material (4) by a layer of resist (11). In the next step (a'), an assembly (2) is provided by patterning the resist layer (11). The patterning comprises exposure through a mask and development. Next, in step b', $O_2+Cl_2$ plasma etch is used to trim the resist lines 6 to target CD and remove the X-PS (4) exposed to the plasma. In step c', the remaining resist (6t) is stripped at room temperature with Orgasolv™ STR 301 and a P(S-r-MMA)-OH brush is spun and annealed for 5 min at 250° C. in a $N_2$ atmosphere. Non-reacted material is rinsed with RER600. The PS-b-PMMA block copolymer is then coated on the chemical patterns and annealed for 5 min at 250° C. in a $N_2$ atmosphere (not shown).

Figure 2:
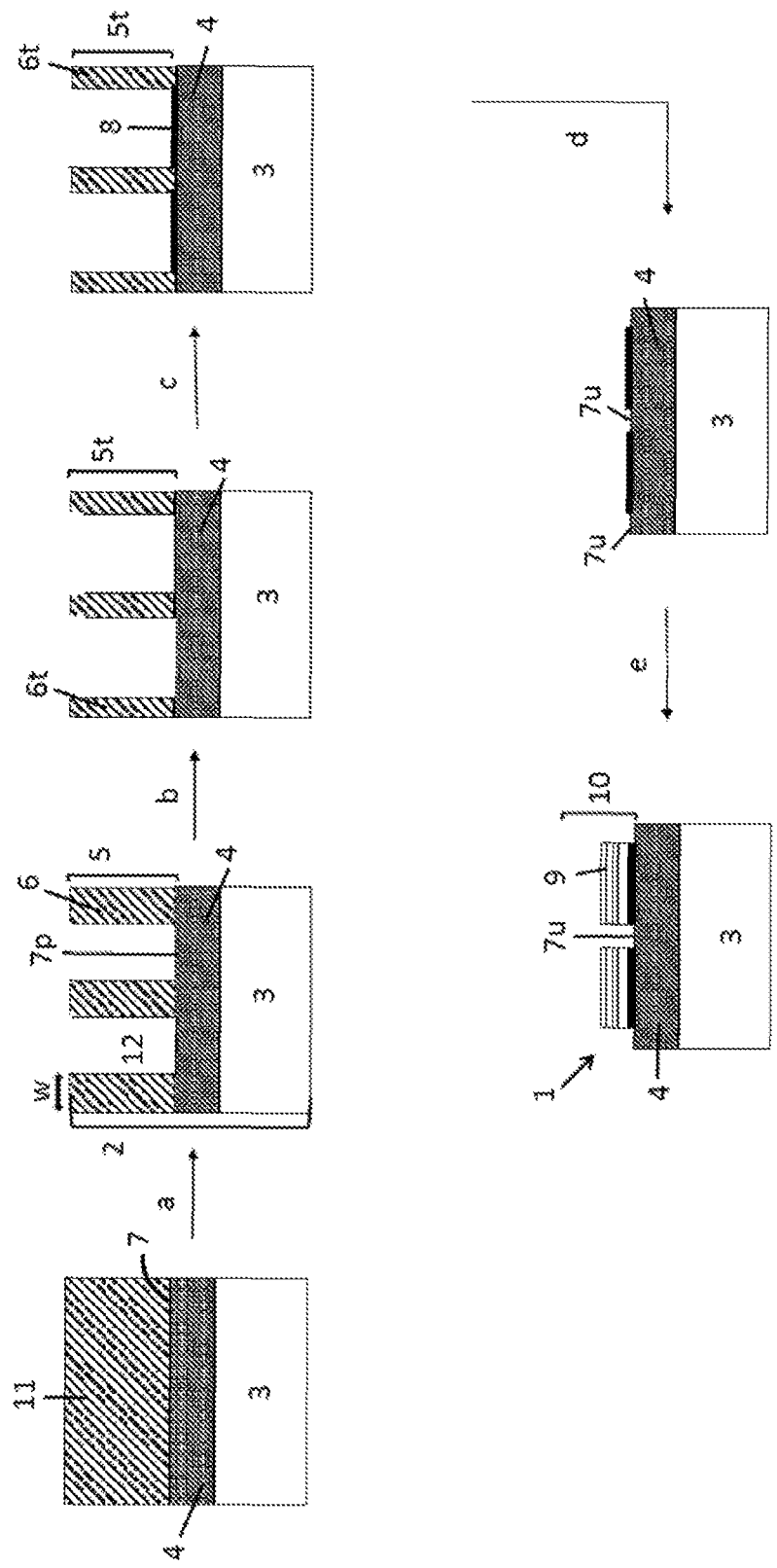
FIG. 2 is a schematic representation of a method, according to example embodiments.

A method according to embodiments of the first aspect is illustrated in FIG. 2.

On the top left of FIG. 2, it shows an assembly formed by overlaying a substrate (3) with a layer of pinning material (4), followed by the overlaying of the top surface (7) of the pinning material (4) by a layer of resist (11).

The substrate (3) can be monolithic or can be a layered structure. The substrate (3) is not particularly critical. The substrate (3) can for instance be a semiconductor substrate (3) or be a layered structure on a semiconductor base. For instance, the substrate (3) may comprise a (e.g. semiconductor) base and an anti-reflective top layer. The semiconductor may for instance be Si or Ge. The semiconductor substrate (3) can for instance be a Si substrate (3) such as a Si wafer (3). The substrate (3) can also for instance have a Si wafer base and a $SiN_x$ anti-reflective top layer.

In embodiments, the pinning layer (4) may be a cross-linked polystyrene (X-PS).

In other embodiments, the pinning layer (4) may be a cross-linked poly(methyl methacrylate) (X-PMMA). X-PMMA can be an improvement over X-PS by being more easily modified in step c. In particular, wet techniques or UV light exposures suitable for modifying the pinning layer (4) are typically more efficient on X-PMMA than on X-PS.

In step a, an assembly (2) may be provided by patterning the resist layer (11). The patterning may typically comprise exposure through a mask and development. The resist pattern (5) may be a pattern of parallel lines (6) and spaces (12). The thickness (i.e. the height) of the lines is not critical. The pitch from one edge of a line (6) to the corresponding edge of the next line (6) may be from few tens of nanometers to several hundred nanometers. For instance, it may be from 20 nm to 800 nm. The resist lines may have a width (w) ranging from 20 to 100 nm. The width of the resist lines can be chosen so that after the optional step b it is within 30%, or even within 20%, or even further within 10%, or may be equal to the pitch (i.e. the bulk lamellar period) of the self-assembling material that will be used in step f. The resist lines (6) leave a part (7p) of the top surface (7) of the pinning layer (4) exposed.

In step b, the width (w) of the resist lines (6) is reduced while maintaining the layer of pinning material (4) un-etched, thereby providing a trimmed resist pattern (5t) comprising trimmed resist lines (6t). The width of the trimmed resist lines can for instance be within a range of from 5 to 50 nm. Leaving the pinning material (4) un-etched is important so as to provide a flat surface (7p) on which a neutral layer (9) will subsequently be deposited to form a pattern of parallel neutral lines. It also can allow avoiding the use of a plasma trimming process which has several disadvantages. One such disadvantage is that the material of which the photoresist is made is modified during plasma trimming. This is due to the interaction between the plasma and the photoresist material. As a consequence, the photoresist material hardens and becomes much more difficult to subsequently strip. Its stripping therefore uses an aggressive chemistry which is not ideal for safety and environmental reasons. Another disadvantage of using a plasma etch for the trimming is that the etching of the pinning material (4) thereby cannot be avoided. This would not be too big of a problem if the speed of etching was the same for the resist lines (6) and for the pinning material (4). This is however not the case, leading to sloped side-wall profiles of the pinning (guide) lines (4). Sloped side walls leads to worse chemical pattern geometry and therefore worse DSA guiding forces than straight side walls. Sloped side walls may result in higher defectivity levels post-DSA process. Finally, the presence of the slope interferes with the etching process involved in the etching of the DSA lines. Additional breakthrough steps become necessary to get rid of the sidewalls and even with these additional steps, a bimodal distribution in the width of the lines and spaces is observed. The use of a chemical trimming instead of a plasma trimming is also expected to lead to a better pattern transfer results when a process like sequential infiltration synthesis (SIS) is used. SIS improves the etch resistance of the patterning materials after the patterning process. In SIS a volatile metal precursor is allowed to diffuse into the nano-structured organic polymer matrix. In a subsequent oxidation step a metal oxide is formed and the process may be repeated a number of times until the metal content in the polymer film increases the etch resistance to the desired level. In the case of block copolymer for use in directed self-assembly, this process can be tuned to be selective to one of the blocks allowing for a selective functionalization. Etching of the block that has not been infiltrated leads to less roughness in the remaining un-etched lines than in absence of SIS.

Another disadvantage of the plasma etching is that these side walls have been affected by the plasma, which in turn affects the guiding strength of these walls. Example embodiments solve this problem by doing without the trenches in the pinning material altogether. Another problem of using the plasma etch process for trimming the width (w) of the resist lines (6) is that the control of target width (i.e. the target critical dimension, CD) is difficult and prone to variability in the etch process such as center weighted-ness amongst others.

In embodiments, step b may comprise: coating the resist pattern with a chemical trim composition suitable for reducing the width of the pattern lines (6) upon heating (not shown), and heating the composition.

In embodiments, the resist pattern lines (5) may have non-decomposed protecting groups on their sidewalls and the chemical trim composition may comprise a base suitable for decomposing the non-decomposed protecting groups upon heating.

In another embodiment, if the resist is by itself a thermally shrinkable resist, step b may comprise heating the thermally shrinkable resist.

Step b can be much improved compared to step b' but is nevertheless optional. Indeed, while the method disclosed in Delgadillo et al. used guiding X-PS lines having a width of 17 nm and a self-assembling material having a pitch ($L_O$) of 28 nm, the method may work best when the unexposed parts (7u), which serve as guiding stripes, have a width closer to the self-assembling material pitch. As a result, if the pitch in the self-assembling material is large enough, step b can be omitted. Since features down to 20 nm width can be obtained with current immersion photolithography techniques, if the pitch in the self-assembling material used in step f is larger or equal to 20 nm, the trimming step b can be dispensed with. With current technologies, if this pitch is lower than 20 nm, step b may be used. Independently of the current or future state of lithographic technology, step b can permit a further reduction in feature width and therefore will permit the use of self-assembling materials of lower pitch, without certain damaging side effects.

Not performing step b may allow one less step, i.e. no plasma trimming of the resist pattern lines is used, thereby avoiding modification of the chemical nature of the resist pattern lines and avoiding modification of the layer of pinning material (e.g. X-PS layer or X-PMMA layer). As a result, the resist lines obtained during the method do not use aggressive stripping chemistries for their removal. Further, the width of the pattern lines and the width of the unmodified portion (7u) of the top surface (7) of the layer of pinning material (4) may be exactly the same, which enables high control and predictability.

In step c, the chemical nature of the exposed part (7p) of the top surface (7) of the pinning layer (4) is modified to provide chemical groups (8) suitable for attaching a neutral layer (9), the neutral layer (9) having substantially the same affinity toward the first and the second components of the self-assembling material.

In embodiments, the neutral layer (9) may have a thickness of from 3 to 15 nm.

In embodiments, step c may comprise functionalising the exposed part (7p) of the top surface (7) of the pinning layer (4) with hydroxyl groups (8). Hydroxyl groups are versatile groups enabling chemical coupling with a large variety of neutral layer. In particular, neutral layers formed of a hydroxyl-terminated random copolymer of polystyrene and methyl methacrylate bonds with the hydroxyl groups present on the neutral layer.

In embodiments, functionalizing the exposed part (7p) of the top surface (7) of the pinning layer (4) with hydroxyl groups (8) may comprise contacting the exposed part (7p) with reactive oxygen species.

In embodiments, contacting the exposed part (7p) with reactive oxygen species may comprise:
 exposing the exposed part (7p) to UV light suitable for generating the reactive oxygen species (like ozone) from air, or
 contacting the exposed part (7p) with an oxygen plasma under conditions suitable for functionalizing the exposed part (7p) with hydroxyl groups (8) without etching the layer of pinning material (4).

In some embodiments, where step c involves a UV treatment, all steps of the method as well as all preceding and subsequent steps of the DSA process can be carried out in a single process flow using only a lithography cluster (scanner and track).

In embodiments, where step c involves a UV treatment, the UV exposure dose may be from 50 to 200 mJ cm$^{-2}$ such as from 60 to 180 mJ cm$^{-2}$, or even from 70 to 110 mJ cm$^{-2}$ such as from 70 to 90 mJ cm$^{-2}$.

Contrarily to the exposure dose, the exposure time depends on the lamp power and is not very relevant. For the sake of merely giving an example, the exposure dose may for instance be provided over an exposing time of from 2 s to 60 s, such as from 5 to 15 s. For illustration, the UV exposure dose may be from 70 to 90 mJ cm$^{-2}$ and the exposure time from 5 to 15 s.

In some embodiments, where step c involves a UV treatment, step c may involve a vacuum UV (VUV) treatment, i.e. a treatment at from 100 to 200 nm. This can permit a generation of ozone from the oxygen in air. For instance, a suitable range for the UV source is 160-170 nm.

In embodiments, where step c involves an oxygen plasma treatment, the diluting gas used may for instance be selected from He, Ar, or $N_2$.

In embodiments, where step c involves an oxygen plasma treatment, the bias power may be from 40V to 100V.

In embodiments, where step c involves an oxygen plasma treatment, the chuck temperature may be from 20° C. to 100° C.

In embodiments, where step c involves an oxygen plasma treatment, the treatment time may be from 1 s to 15 s, such as from 2 to 15 s.

In embodiments, where step c involves an oxygen plasma treatment, the flow rate used for the oxygen gas can be in the range 10-500 sccm and the flow rate used for the diluent gas (e.g. $N_2$, He or Ar) may be in the range 10-500 sccm.

In step d, the trimmed resist pattern (5t) is removed, thereby uncovering an unmodified portion (7u) of the top surface (7) of the layer of pinning material (4), and In step e, the neutral layer (9) is attached to the modified pinning layer (4) by reacting the neutral layer (9) with the chemical groups (8), thereby forming a neutral layer pattern (10) and providing a pre-patterned structure (1).

In embodiments, the neutral layer pattern (10) may comprise parallel lines (9) of neutral material defining trenches there between exposing parallel lines (7u) of pinning material (7).

The pre-patterned structure obtained by the method of the first aspect is suitable for directing the self-assembly of a self-assembling material comprising a first and a second component of different chemical natures, the pre-patterned structure (1) comprising:

A substrate (3),

A layer of pinning material (4) overlying the substrate and having a top surface (7) having more affinity for one of the components than for the other, and A pattern (10) overlying the layer of pinning material, and formed of a neutral material having substantially the same affinity toward the first and the second components of the self-assembling material, the pattern (10) having a thickness of from 3 to 15 nm.

In embodiments, the pattern (10) of neutral material may comprise parallel lines (9) of neutral material separated by exposed parallel lines (7u) of pinning material. In other words, since the top surface of the parallel lines (9) of neutral material is higher than the top surface of the layer of pinning material, the pattern (10) of neutral material may comprise parallel lines (9) of neutral material defining trenches there between exposing parallel lines (7u) of pinning material. The alternating chemical nature of the neutral lines and the pinning lines provide the chemoepitaxy impetus for the directed self-assembly of the self-assembling material (e.g. the block copolymer). The difference in relief (height) between the neutral lines (which have a thickness of 3-15 nm) and the pinning lines (which are therefore 3-15 nm lower than the neutral lines) provides graphoepitaxy impetus for the directed self-assembly of the self-assembling material.

The method may further comprise a step f (not shown) overlaying the pre-patterned structure (1) with the self-assembling material. The method then relates to a method for forming a patterned structure (not shown).

The self-assembling material may be chosen so that it can self-assemble into a lamellar structure of pitch $L_0$.

In embodiments, the self-assembling material may be a block copolymer and the first and the second components are blocks of the block copolymer.

In embodiments, the block copolymer may be a poly (styrene-b-methyl methacrylate).

In embodiments, the first and the second components may be blocks formed of a first polymerized monomer and a second polymerized monomer respectively, and the neutral layer (9) may be a random or alternating copolymer of the first polymerized monomer and the second polymerized monomer.

After the completion of step f, the patterned structure further comprises the self-assembling material coated thereon. In embodiments, a further step (g) (not shown) of removing selectively one of both components of the self-assembled material may be performed. When the self-assembling material is a block copolymer, the component removed in step (g) may be one of the blocks. For instance, when the block copolymer is a poly(styrene-b-methyl methacrylate), step (g) may comprise removing the PMMA block. This can for instance be done with an $O_2$ plasma.

In a further aspect, the pre-patterned structure and the self-assembling material may be provided as a kit of part.

EXAMPLES

Still referring to FIG. 2, a particular example of method according to the first aspect will now be described.

Materials:

Cross-linkable poly(styrene) (X-PS, AZEMBLY™ NLD128), cross-linkable poly(methyl methacrylate) (X-PMMA, AZEMBLY™ NLD 234) hydroxyl-terminated poly(styrene-random-methyl methacrylate) (P(S-r-MMA)-OH) brush (AZEMBLY™ NLD127), and poly(styrene-block-methyl methacrylate) (PS-b-PMMA, AZEMBLY™ PME312) BCP with $L_0$=28 nm, were synthesized by Merck Performance Materials and were used as received. TARF-PI6-144 ME resist (120 nm), ASF-Tr113LT-K and ASF-Tr159LT-S (trimming compositions), NMD-3 (development solution) were obtained from Tokyo Ohka Kogyo co., LTD, Organic solvent RER600 was purchased from Fujifilm.

Example 1

Figure 4:
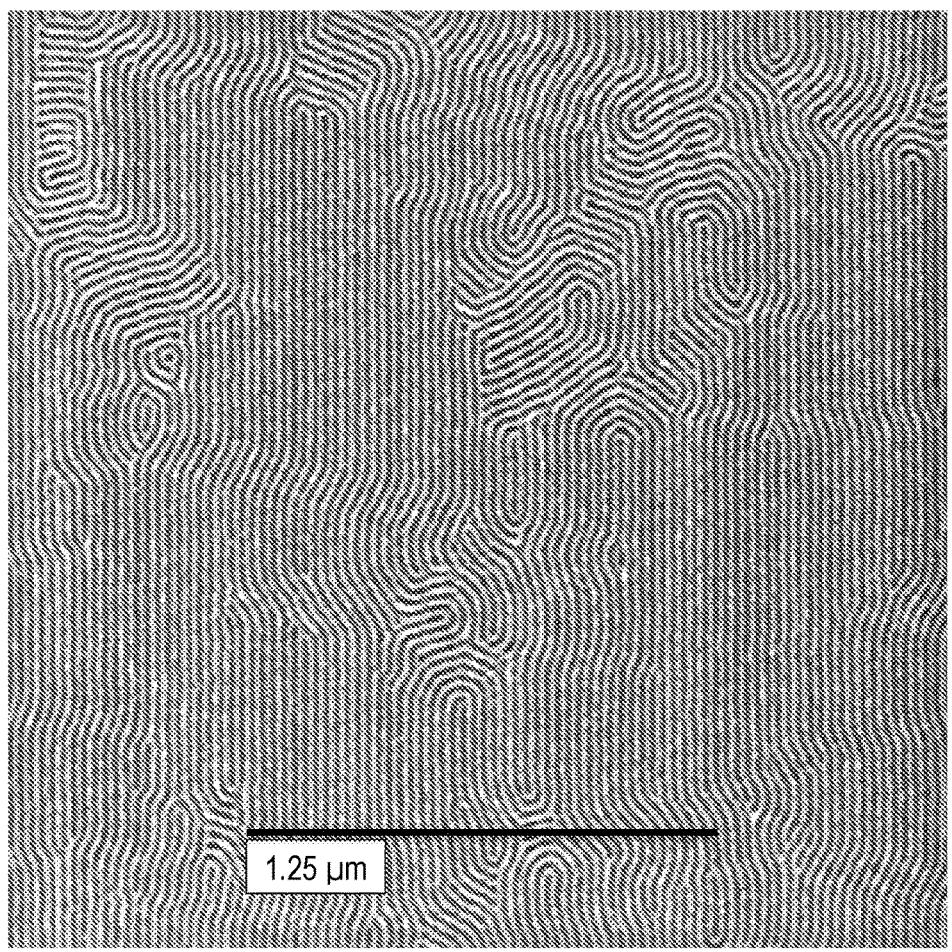
FIG. 4 is a scanning electron microscope (SEM) image after PMMA removal subsequent to a directed self-assembly of a PS-b-PMMA on a pre-pattern structure, according to example embodiments where a UV exposure was used for step c.

All processing was performed on TEL CLEAN TRACK ACT™12 and TEL CLEAN TRACK LITHIUS™ ProZ systems. An inorganic antireflective coating (ARC) film of SiN, of 13 nm, was deposited via chemical vapor deposition (CVD) on 300 mm Si wafers. This assembly Si base/SiN layer was used as the substrate (3) in FIG. 2. The X-PS film (4), with thickness of 7-8 nm, was spun on the substrate (3) and annealed at high temperature for 5 min under a $N_2$ atmosphere. After resist coating, exposure, and development using vendor recommended settings (exposure with NA: 1.35, sigma in/out 0.72/0.87; development with OPD-262 (GP-Nozzle)), a set of parallel resist lines (6) and spaces (12) of 84 nm pitch and line width (w, CD) of 35 nm were obtained (step a). The resist pattern (5) was then coated with the water-based chemical trim composition ASF-Tr113LT-K. The thickness of the resulting coating was 100 nm. This coating was then baked at 100° C. for 60 s, thereby reducing the width of the lines (6) by about 15 nm (step b). The lines (6t) were then rinsed with deionized water for 100 s. The exposed part (7p) were then exposed to the vacuum UV light of the TEL Lithius Pro™ (wavelength of the source in the range 160-170 nm) (110 mJ cm$^{-2}$, 10 s) in presence of air thereby generating reactive oxygen species, thereby oxidizing the substrate (3) and forming hydroxyl groups thereon. The remaining resist was stripped at room temperature with a standard solvent RER™ 600 instead of Orgasolv™ STR 301. The P(S-r-MMA)-OH brush was spun on the assembly comprising the trimmed resist lines and annealed for 5 min at 250° C. in a $N_2$ atmosphere (step e). Non-reacted material was rinsed with RER600. The PS-b-PMMA BCP was coated on the chemical patterns and annealed for 5 min at 250° C. in a $N_2$ atmosphere (step f, not shown). The PMMA was then removed with $O_2$ plasma, providing the pattern captured in the SEM image of FIG. 4. As can be observed, the major part of the sample is successfully oriented, thereby providing a proof of principle. Initial results promise improvement at lower UV dose in the range 70 to 90 mJ cm$^{-2}$.

Example 2

Figure 3:
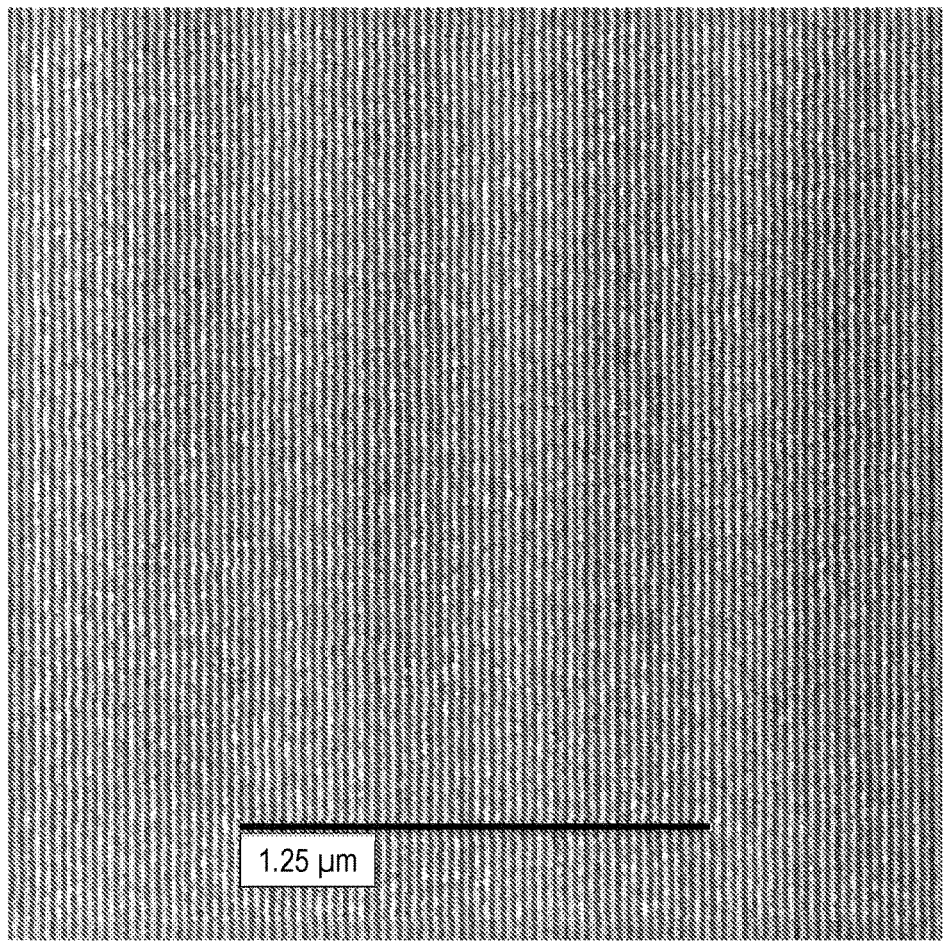
FIG. 3 is a scanning electron microscope (SEM) image after PMMA removal subsequent to a directed self-assembly of a PS-b-PMMA on a pre-pattern structure, according to example embodiments where an oxygen plasma flash was used for step c.

Example 1 is repeated except that step c is performed by using an $O_2/N_2$ plasma flash (2s) with 70V bias power and flow rates of 20 sccm for $O_2$ and 100 sccm for $N_2$ (instead of using UV+air). The pattern obtained after PMMA removal is visible in the SEM image of FIG. 3. As can be observed, excellent directed self-assembly was obtained over large areas.

Examples 3 and 4

Examples 1 and 2 are repeated except that ASF-Tr159LT-S is used instead of ASF-Tr113LT-K in step b and that the lines (6t) are rinsed with deionized water for 100 s.

Examples 5a, 5b, and 5c

Example 1 was repeated except that:
step a was modified by, instead of spinning an X-PS film (4) on the substrate (3), spinning an X-PMMA film, with a thickness of 7 nm,
step a was performed so as to obtain a set of parallel resist lines (6) and spaces (12) of 84 nm pitch and line width (w, CD) of 28 nm,
step b was skipped, and
step c was performed with doses of 125 (Example 5a), 150 (Example 5b) or 175 mJ cm$^{-2}$ (Example 5c). These higher doses helped achieving the 28 nm width without the trimming step,
step e was modified by performing the annealing for 10 min at 230° C. instead of 5 minutes at 250° C.
Perpendicular block co-polymer assembly was observed for each of Examples 5a, 5b and 5c, indicating that the UV treatment is suitable for successfully modifying the pinning layer for P(S-r-MMA)-OH brush grafting.

It is to be understood that although certain embodiments, specific constructions and configurations, as well as materials, have been discussed herein, various changes or modifications in form and detail may be made without departing from the scope of the claims. For example, any formulas given above are merely representative of procedures that may be used. Functionality may be added or deleted from the block diagrams and operations may be interchanged among functional blocks. Steps may be added or deleted to methods described within the scope of the present disclosure and claims.

What is claimed is:
1. A method of forming a pre-patterned structure for directing a self-assembly of a self-assembling material comprising a first and a second component having different chemical natures, the method comprising:
  providing an assembly comprising:
    a substrate;
    a layer of pinning material overlying the substrate and having a top surface having a greater affinity for one of the components than for another; and
    a resist pattern overlying the layer of pinning material, comprising resist lines having a width, and leaving part of the top surface of the layer of pinning material exposed;
  modifying a chemical nature of the exposed part of the top surface of the layer of pinning material to provide chemical groups suitable for attaching a neutral layer, wherein the neutral layer has affinities toward the first and the second components of the self-assembling material that are substantially similar;
  removing the resist pattern, thereby uncovering an unmodified portion of the top surface of the layer of pinning material; and
  attaching the neutral layer to the layer of pinning material by reacting the neutral layer with the chemical groups, thereby forming a neutral layer pattern and providing the pre-patterned structure.

2. The method according to claim 1, further comprising overlaying the pre-patterned structure with the self-assembling material.

3. The method according to claim 1, wherein the self-assembling material is a block copolymer, and wherein the first and the second components are blocks of the block copolymer.

4. The method according to claim 3, wherein the block copolymer is a poly(styrene-b-methyl methacrylate).

5. The method according to claim 1, wherein the layer of pinning material is a cross-linked polystyrene or a cross-linked poly(methyl methacrylate).

6. The method according to claim 1, further comprising reducing the width of the resist lines while maintaining the layer of pinning material un-etched, thereby providing a trimmed resist pattern comprising trimmed resist lines.

7. The method according to claim 6, wherein reducing the width of the resist lines while maintaining the layer of pinning material un-etched comprises:
  coating the resist pattern with a chemical trim composition suitable for reducing the width of the resist lines upon heating, and
  heating the chemical trim composition.

8. The method according to claim 7, wherein the resist pattern comprises non-decomposed protecting groups on sidewalls of the resist pattern, and wherein the chemical trim composition comprises a base suitable for decomposing the non-decomposed protecting groups upon heating.

9. The method according to claim 1, wherein modifying the chemical nature of the exposed part of the top surface of the layer of pinning material comprises functionalizing the exposed part of the top surface of the layer of pinning material with hydroxyl groups.

10. The method according to claim 9, wherein functionalizing the exposed part of the top surface of the layer of pinning material with hydroxyl groups comprises contacting the exposed part with reactive oxygen species.

11. The method according to claim 10, wherein contacting the exposed part with reactive oxygen species comprises:
exposing the exposed part to ultaviolet (UV) light suitable for generating the reactive oxygen species from air; or
contacting the exposed part with an oxygen plasma under conditions suitable for functionalizing the exposed part with hydroxyl groups without etching the layer of pinning material.

12. The method according to claim 1, wherein the first and the second components are blocks formed of a first polymerized monomer and a second polymerized monomer, respectively, and wherein the neutral layer is a random or alternating copolymer of the first polymerized monomer and the second polymerized monomer.

13. The method according to claim 1, wherein the neutral layer has a thickness of between 3 nm and 15 nm.

14. The method according to claim 1, wherein the neutral layer comprises parallel lines of neutral material defining trenches there between exposing parallel lines of pinning material.

15. A self-assembly of a self-assembling material comprising a first and a second component having different chemical natures, wherein the self-assembly was self-assembled in a directed manner according to a pre-pattered structure, and wherein the pre-patterned structure was formed by a method comprising:
providing an assembly comprising:
a substrate;
a layer of pinning material overlying the substrate and having a top surface having a greater affinity for one of the components than for another; and
a resist pattern overlying the layer of pinning material, comprising resist lines having a width, and leaving part of the top surface of the layer of pinning material exposed;
modifying a chemical nature of the exposed part of the top surface of the layer of pinning material to provide chemical groups suitable for attaching a neutral layer, wherein the neutral layer has affinities toward the first and the second components of the self-assembling material that are substantially similar;
removing the resist pattern, thereby uncovering an unmodified portion of the top surface of the layer of pinning material; and
attaching the neutral layer to the layer of pinning material by reacting the neutral layer with the chemical groups, thereby forming a neutral layer pattern and providing the pre-patterned structure.

16. The self-assembly according to claim 15, wherein the self-assembling material is a block copolymer, and wherein the first and the second components are blocks of the block copolymer.

17. The self-assembly according to claim 16, wherein the block copolymer is a poly(styrene-b-methyl methacrylate).

* * * * *